United States Patent [19]

Cornu et al.

[11] 4,236,090
[45] Nov. 25, 1980

[54] SIGNAL GENERATOR AND SIGNAL CONVERTER USING SAME

[75] Inventors: Jozef Cornu, Stekene; Jean R. J. M. Taeymans, Wilrijk; Jacques Talbot, Brussels, all of Belgium

[73] Assignee: International Standard Electric Corporation, New York, N.Y.

[21] Appl. No.: 931,650

[22] Filed: Aug. 8, 1978

[51] Int. Cl.³ .......................... H03K 4/02; H03K 3/35
[52] U.S. Cl. ................. 307/268; 307/221 D; 307/227
[58] Field of Search ............... 328/142, 143; 307/221 D, 260, 268, 227

[56] References Cited

U.S. PATENT DOCUMENTS

| | | | |
|---|---|---|---|
| 3,500,213 | 3/1970 | Ameau | 328/142 X |
| 3,521,170 | 7/1970 | Leuthold et al. | 328/142 X |
| 3,746,883 | 7/1973 | Kovac | 307/221 D |
| 3,919,468 | 11/1975 | Weimer | 307/221 D X |

Primary Examiner—John S. Heyman
Attorney, Agent, or Firm—John T. O'Halloran; Alfred C. Hill

[57] ABSTRACT

The signal generator comprises a charge transfer device providing an output signal having any desired shape so that it is particularly useful in an A/D or D/A converter. In this device charges are transferred under electrodes of which some are split in order to obtain charge portions which are then removed or transferred to the output of the device where they are added to or subtracted from previous charge portions to finally obtain a desired output signal.

24 Claims, 12 Drawing Figures

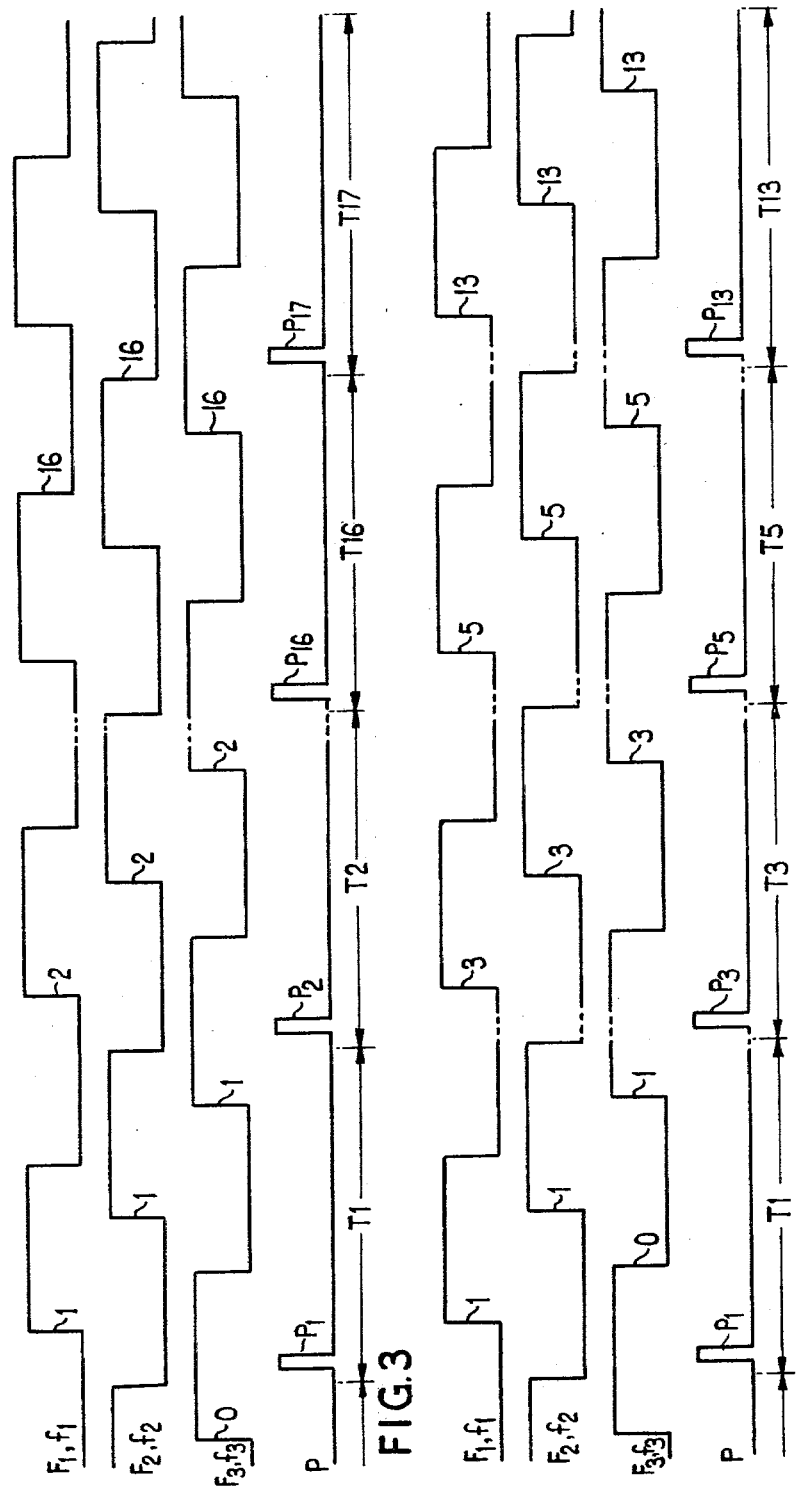

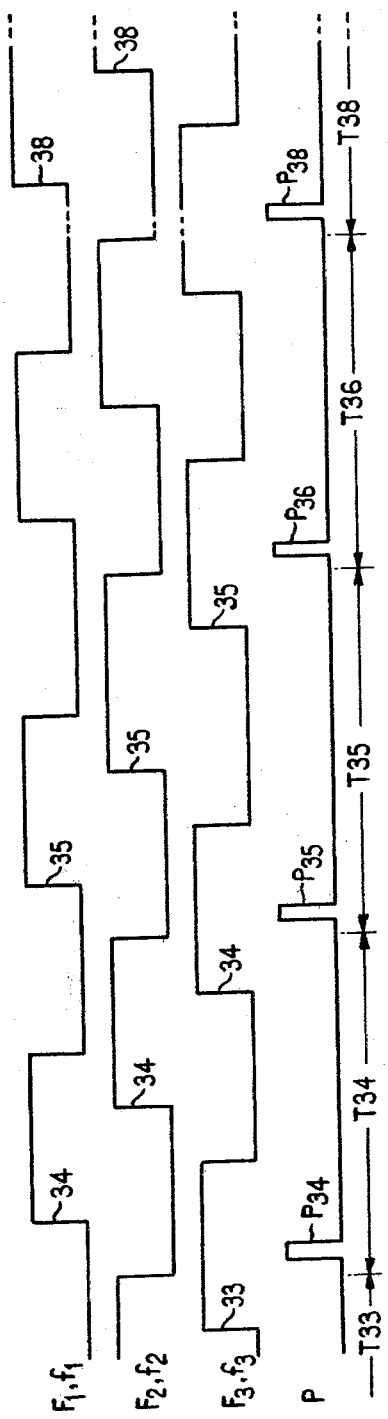

FIG. 6

| CELLS / T | C1 | C2 | C3 | C4 | C5 | C6 | C7 | C8 | C9 | C10 | C11 | C12 | C13 | C14 | C15 | C16 | COMP |
|---|---|---|---|---|---|---|---|---|---|---|---|---|---|---|---|---|---|
| 1 | $Q_{in}$ | | | | | | | | | | | | | | | | |
| 17-38 | $Q_{in}$ | $Q_{in}$ | $Q_{in}$ | $Q_{in}$ | $Q_{in}$ | $Q_{in}$ | $Q_{in}$ | $Q_{in}$ | $Q_{in}$ | $Q_{in}$ | $Q_{in}$ | $Q_{in}$ | $Q_{in}$ | $Q_{in}$ | $Q_{in}$ | $Q_{in}$ | |
| 1 | $\frac{q_r}{2}$ | | | | | | | | | | | | | | | | |
| 2 | $\frac{q_r}{2}$ | $\frac{q_r}{4}$ | | | | | | | | | | | | | | | |
| 3 | $\frac{q_r}{2}$ | $\frac{q_r}{4}$ | $\frac{q_r}{8}$ | | | | | | | | | | | | | | |
| 4 | $\frac{q_r}{2}$ | $\frac{q_r}{4}$ | $\frac{q_r}{8}$ | $\frac{q_r}{16}$ | | | | | | | | | | | | | |
| 5 | $\frac{q_r}{2}$ | $\frac{q_r}{4}$ | $\frac{q_r}{8}$ | $\frac{q_r}{16}$ | $\frac{q_r}{32}$ | | | | | | | | | | | | |
| 6 | $\frac{q_r}{2}$ | $\frac{q_r}{4}$ | $\frac{q_r}{8}$ | $\frac{q_r}{16}$ | $\frac{q_r}{32}$ | $\frac{q_r}{64}$ | | | | | | | | | | | |
| 7 | $\frac{q_r}{2}$ | $\frac{q_r}{4}$ | $\frac{q_r}{8}$ | $\frac{q_r}{16}$ | $\frac{q_r}{32}$ | $\frac{q_r}{64}$ | $\frac{q_r}{128}$ | | | | | | | | | | |
| 8 | $\frac{q_r}{2}$ | $\frac{q_r}{4}$ | $\frac{q_r}{8}$ | $\frac{q_r}{16}$ | $\frac{q_r}{32}$ | $\frac{q_r}{64}$ | $\frac{q_r}{128}$ | $\frac{q_r}{128}$ | | | | | | | | | |
| 9 | $\frac{q_r}{2}$ | $\frac{q_r}{4}$ | $\frac{q_r}{8}$ | $\frac{q_r}{16}$ | $\frac{q_r}{32}$ | $\frac{q_r}{64}$ | $\frac{q_r}{128}$ | $\frac{q_r}{128}$ | $\frac{q_r}{128}$ | | | | | | | | |
| 10 | $\frac{q_r}{2}$ | $\frac{q_r}{4}$ | $\frac{q_r}{8}$ | $\frac{q_r}{16}$ | $\frac{q_r}{32}$ | $\frac{q_r}{64}$ | $\frac{q_r}{128}$ | $\frac{q_r}{128}$ | $\frac{q_r}{128}$ | $\frac{q_r}{128}$ | | | | | | | |
| 11 | $\frac{q_r}{2}$ | $\frac{q_r}{4}$ | $\frac{q_r}{8}$ | $\frac{q_r}{16}$ | $\frac{q_r}{32}$ | $\frac{q_r}{64}$ | $\frac{q_r}{128}$ | $\frac{q_r}{128}$ | $\frac{q_r}{128}$ | $\frac{q_r}{128}$ | $\frac{q_r}{128}$ | | | | | | |
| 12 | $\frac{q_r}{2}$ | $\frac{q_r}{4}$ | $\frac{q_r}{8}$ | $\frac{q_r}{16}$ | $\frac{q_r}{32}$ | $\frac{q_r}{64}$ | $\frac{q_r}{128}$ | $\frac{q_r}{128}$ | $\frac{q_r}{128}$ | $\frac{q_r}{128}$ | $\frac{q_r}{128}$ | $\frac{q_r}{64}$ | | | | | |
| 13 | $\frac{q_r}{2}$ | $\frac{q_r}{4}$ | $\frac{q_r}{8}$ | $\frac{q_r}{16}$ | $\frac{q_r}{32}$ | $\frac{q_r}{64}$ | $\frac{q_r}{128}$ | $\frac{q_r}{128}$ | $\frac{q_r}{128}$ | $\frac{q_r}{128}$ | $\frac{q_r}{64}$ | $\frac{q_r}{32}$ | $\frac{q_r}{32}$ | | | | |
| 14 | $\frac{q_r}{2}$ | $\frac{q_r}{4}$ | $\frac{q_r}{8}$ | $\frac{q_r}{16}$ | $\frac{q_r}{32}$ | $\frac{q_r}{64}$ | $\frac{q_r}{128}$ | $\frac{q_r}{128}$ | $\frac{q_r}{128}$ | $\frac{q_r}{64}$ | $\frac{q_r}{32}$ | $\frac{q_r}{16}$ | $\frac{q_r}{16}$ | $\frac{q_r}{16}$ | | | |
| 15 | $\frac{q_r}{2}$ | $\frac{q_r}{4}$ | $\frac{q_r}{8}$ | $\frac{q_r}{16}$ | $\frac{q_r}{32}$ | $\frac{q_r}{64}$ | $\frac{q_r}{128}$ | $\frac{q_r}{128}$ | $\frac{q_r}{64}$ | $\frac{q_r}{32}$ | $\frac{q_r}{16}$ | $\frac{q_r}{8}$ | $\frac{q_r}{8}$ | $\frac{q_r}{8}$ | $\frac{q_r}{8}$ | | |
| 16 | $\frac{q_r}{2}$ | $\frac{q_r}{4}$ | $\frac{q_r}{8}$ | $\frac{q_r}{16}$ | $\frac{q_r}{32}$ | $\frac{q_r}{64}$ | $\frac{q_r}{128}$ | $\frac{q_r}{64}$ | $\frac{q_r}{32}$ | $\frac{q_r}{16}$ | $\frac{q_r}{8}$ | $\frac{q_r}{4}$ | $\frac{q_r}{4}$ | $\frac{q_r}{4}$ | $\frac{q_r}{4}$ | $\frac{q_r}{4}$ | |
| 17 | $\frac{q_r}{2}$ | $\frac{q_r}{4}$ | $\frac{q_r}{8}$ | $\frac{q_r}{16}$ | $\frac{q_r}{32}$ | $\frac{q_r}{64}$ | $\frac{q_r}{128}$ | $\frac{q_r}{128}$ | $\frac{q_r}{128}$ | $\frac{q_r}{128}$ | $\frac{q_r}{128}$ | $\frac{q_r}{64}$ | $\frac{q_r}{32}$ | $\frac{q_r}{16}$ | $\frac{q_r}{8}$ | $\frac{q_r}{4}$ | $Q_{in}-\frac{q_r}{2}$ |

| CELLS T | C1 | C2 | C3 | C4 | C5 | C6 | C7 | C8 | C9 | C10 | C11 | C12 | C13 | C14 | C15 | C16 | COMP |
|---|---|---|---|---|---|---|---|---|---|---|---|---|---|---|---|---|---|
| 18 | Qr/2 | Qr/4 | Qr/8 | Qr/16 | Qr/32 | Qr/64 | Qr/128 | Qr/128 | Qr/128 | Qr/128 | Qr/128 | Qr/128 | Qr/64 | Qr/32 | Qr/16 | Qr/8 | Qin−Qr/4 |
| 19 | Qr/2 | Qr/4 | Qr/8 | Qr/16 | Qr/32 | Qr/32 | Qr/64 | Qr/128 | Qr/128 | Qr/128 | Qr/128 | Qr/128 | Qr/128 | Qr/64 | Qr/32 | Qr/16 | Qin−Qr/8 |
| 20 | Qr/2 | Qr/4 | Qr/8 | Qr/8 | Qr/16 | Qr/32 | Qr/32 | Qr/64 | Qr/128 | Qr/128 | Qr/128 | Qr/128 | Qr/128 | Qr/128 | Qr/64 | Qr/32 | Qin−Qr/16 |
| 21 | Qr/2 | Qr/4 | Qr/4 | Qr/4 | Qr/4 | Qr/4 | Qr/4 | Qr/32 | Qr/64 | Qr/64 | Qr/128 | Qr/128 | Qr/128 | Qr/128 | Qr/64 | Qr/64 | Qin−Qr/32 |
| 22 | ″ | ″ | | | | | | Qr/16 | Qr/32 | Qr/32 | Qr/64 | Qr/128 | Qr/128 | Qr/128 | Qr/128 | Qr/128 | Qin−Qr/64 |
| 23 | ″ | ″ | | | | | | Qr/8 | Qr/16 | Qr/16 | Qr/32 | Qr/64 | Qr/128 | Qr/128 | Qr/128 | Qr/128 | Qin−Qr/128 |
| 24 | ″ | ″ | | | | | | Qr/4 | Qr/8 | Qr/8 | Qr/16 | Qr/32 | Qr/64 | Qr/128 | Qr/128 | Qr/128 | Qin−Qr/128 |
| 25 | ″ | ″ | | | | | | | Qr/4 | Qr/4 | Qr/8 | Qr/16 | Qr/32 | Qr/128 | Qr/128 | Qr/128 | Qin−Qr/128 |
| 26 | ″ | ″ | | | | | | | | | Qr/4 | Qr/8 | Qr/16 | Qr/64 | Qr/128 | Qr/128 | Qin−Qr/128 |
| 27 | ″ | ″ | | | | | | | | | | Qr/4 | Qr/8 | Qr/32 | Qr/128 | Qr/128 | Qin−Qr/128 |
| 28 | ″ | ″ | | | | | | | | | | | Qr/4 | Qr/16 | Qr/64 | Qr/128 | Qin−Qr/128 |
| 29 | ″ | ″ | | | | | | | | | | | | Qr/8 | Qr/32 | Qr/64 | Qin−Qr/64 |
| 30 | ″ | ″ | | | | | | | | | | | | Qr/4 | Qr/16 | Qr/32 | Qin−Qr/32 |
| 31 | ″ | ″ | | | | | | | | | | | | | Qr/8 | Qr/16 | Qin−Qr/16 |
| 32 | ″ | ″ | | | | | | | | | | | | | Qr/4 | Qr/8 | Qin−Qr/8 |
| 33 | Qr/2 | Qr/4 | Qr/4 | Qr/4 | Qr/4 | Qr/4 | Qr/4 | Qr/4 | Qr/4 | Qr/4 | Qr/4 | Qr/4 | Qr/4 | Qr/4 | Qr/4 | Qr/4 | Qin−Qr/4 |
| 34 | Qr/2 | Qr/4 | Qr/8 | Qr/4 | Qr/4 | Qr/4 | Qr/4 | Qr/8 | Qr/8 | Qr/8 | Qr/8 | Qr/8 | Qr/8 | Qr/4 | Qr/4 | Qr/4 | Qin−Qr/4−Qr/8 |
| 35 | Qr/2 | Qr/4 | Qr/8 | Qr/4 | Qr/4 | Qr/4 | Qr/4 | Qr/8 | Qr/16 | Qr/16 | Qr/16 | Qr/16 | Qr/16 | Qr/8 | Qr/4 | Qr/4 | Qin−Qr/4−Qr/16 |
| 36 | Qr/2 | Qr/4 | Qr/8 | Qr/4 | Qr/4 | Qr/4 | Qr/4 | Qr/8 | Qr/16 | Qr/32 | Qr/32 | Qr/32 | Qr/16 | Qr/16 | Qr/8 | Qr/4 | Qin−Qr/4−Qr/8−Qr/16−Qr/32 |
| 37 | Qr/2 | Qr/4 | Qr/4 | Qr/4 | Qr/4 | Qr/4 | Qr/4 | Qr/8 | Qr/16 | Qr/32 | Qr/64 | Qr/32 | Qr/16 | Qr/8 | Qr/4 | Qr/4 | Qin−Qr/4−Qr/8−Qr/16−Qr/32 |

| CELLS T | LC7 | LC8 | LC9 | LC10 |
|---|---|---|---|---|
| 34 | Qr/4 | Qr/4 | Qr/4 | Qr/4 |
| 35 | Qr/8 | Qr/8 | Qr/8 | Qr/8 |
| 36 | Qr/8 | Qr/16 | Qr/32 | Qr/32 |
| 37 | Qr/8 | Qr/16 | Qr/32 | Qr/64 |

SIGNAL GENERATOR AND SIGNAL CONVERTER USING SAME

BACKGROUND OF THE INVENTION

The present invention relates to a signal generator able to generate at its output a variable output signal, said generator being of the type including at least one transfer device with at least two stages, clocking means to clock an input signal into said transfer device and to step the contents thereof, and an output circuit associated with at least one of said stages and able to collect portions of said input signal therefrom as a function of said variable output signal to be generated and to further process said signal portions.

Such a signal generator is already known from the published French patent application No. 7,520,394 now French Pat. No. 2,315,799. This known signal generator has an output or measuring circuit which includes two differential amplifiers, a sample- and-hold circuit and a switch, one of these differential amplifiers forming an integrator and having two inputs coupled to homologous portions of split electrodes or stages forming part of different cells each including three electrodes. This generator is only able to provide an output signal which varies in a monotonic manner.

SUMMARY OF THE INVENTION

An object of the present invention is to provide a signal generator of the above type but which is of a simpler structure and able to deliver a staircase-shaped variable output signal of any desired form for instance, a waveform with subsequent up and down steps. Such a waveform is particularly useful for converters in which it may be used to arrive at any desired value with a minimum number of steps, i.e. by starting at half the maximum value, by then adding or subtracting one quarter thereof, etc. instead of raise or decrease in a monotonic way.

According to the invention this object is achieved due to the fact that said output circuit includes gating means to selectively collect and gate said signal portions to said output.

By suitably controlling these gating means which can be made very simple, the variable output signal may have any desired staircase shape.

Another characteristic feature of the present signal generator is that prior to said gating means collecting and gating said signal portions from said stages coupled therewith, said clocking means clock said input signal (e.g. Qr/4 in FIG. 8) in all said stages and that said gating means afterwards selectively collect and gate said signal portions (e.g. FIG. 8 right hand table) from said stages to said output according to a predetermined law in order to form thereon successive portions of said variable output signal.

Thus, it is, for instance, possible to generate a staircase-shaped variable output signal having successive different portions or steps corresponding to different fractions of a same signal.

The present signal generator is further characterized in that it includes a second transfer device having an output which is coupled to said output to enable said selectively collected and gated signal portions (e.g. FIG. 8, right hand table) to be combined with, e.g. added to, signals (e.g. Qr/4 in FIG. 8) appearing at said output of said second transfer device and to thus provide a second variable output signal.

Still another characteristic feature of the present signal generator is that prior to said gating means collecting and gating said signal portions from said stages coupled therewith a same second input signal (e.g. Qr/4 in FIG. 8) is clocked in all cells of said second transfer device thus enabling said second input signal to be combined with, e.g. added to, said successive portions of the first variable output signal and thus to provide said second variable output signal.

The present signal generator is further also characterized in that said successive portions of said variable output signal all are fractions of said second input signal (e.g. Qr/4, FIG. 8).

Thus, it is, for instance, possible to add the above mentioned staircase-shaped variable output signal having a plurality of successive different portions or steps corresponding to any of a plurality of fractions of a same signal to the latter signal, i.e. the second reference signal, in order to form a second variable output signal. Such a variable second output signal is useful as a reference signal in converters, more particularly in analog-to-digital converters operating according to a segmented law, e.g. the A-law to determine the digital code of the fraction of the segment of the segmented A-law or /ᵘ-law to which an analog input value belongs, the second reference value being a measure of this segment.

The present signal generator is also characterized in that it includes a third transfer device with a set of auxiliary cells and second gating means associated with said auxiliary cells and able to selectively collect and remove portions of signals stored therein according to a second predetermined law and in order that the signal portions remaining in said third transfer device and stepped therein should form successive portions of a third variable output signal.

Thus, it is, for instance, possible to generate a third staircase-shaped output signal having portions or steps corresponding to the segments of the above mentioned segmented law. This variable output signal is again useful as a reference signal in converters, more particularly in analog-to-digital converters to determine the digital code of the segment of the segmented law to which an analog input value belongs.

The present signal generator is also characterized in that said clocking means, said gating means forming part of the first transfer device and said second gating means operate in such a way that said third variable output signal and said second variable output signal successively appear at said output of said second transfer device.

Thus, it is, for instance, possible to successively use the third and second variable output signals as reference signals in analog-to-digital converters to successively determine to which segment and to which fraction of a segment an analog input signal belongs.

The present invention also relates to a signal converter including a comparator for comparing an input signal with a reference signal and for providing an activated output signal when said input signal and said reference signal satisfy a predetermined relationship, said comparator having a first input for applying said input signal, a second input for applying said reference signal and an output at which appears said output signal, said reference signal being provided by a signal generator.

Such a signal converter, i.e. an Analogue-to-Digital converter or the reverse, is also already known from the above mentioned published French patent application No. 752,0394, now French Pat. No. 2,315,799. This known converter includes the above mentioned known signal generator and is, therefore, only able to compare the input signal with the reference output signal raising in a monotonic manner provided by this generator due to which the conversion takes relatively much time.

A further object of the present invention is to provide a signal converter of the above type, but which does not present this drawback.

According to the invention this object is achieved due to the fact that the present converter includes a signal generator according to the invention, as described above.

In accordance with a preferred embodiment the present signal converter includes a comparator the inputs of which are connected with the output of a signal generator and an input voltage. This generator produces successively a first staircase-shaped reference voltage with a monotonically decreasing part the steps of which correspond to the segments of the A- or /u-law and with a second monotonically raising part the end value of which corresponds to the segment to which the input voltage belongs, and an up-and-down going voltage which is superimposed on this end value and the steps of which correspond to the quanta of this segment.

BRIEF DESCRIPTION OF THE DRAWING

The above mentioned and other objects and features of the invention will become more apparent and the invention itself will be best understood by referring to the following description of an embodiment taken in conjunction with the accompanying drawings wherein:

FIGS. 3 to 5 show pulse waveforms generated by pulse generator PG represented in FIG. 2;

FIG. 6 shows the electric charges present in cells c1 to c16 and C1 to C16 of charge transfer devices ctd and CTD represented in FIG. 1 during the time intervals T1 to T37 and T1 to T17, respectively, and represents the electric charges then applied to the comparator COMP of FIG. 1;

Figure 10:
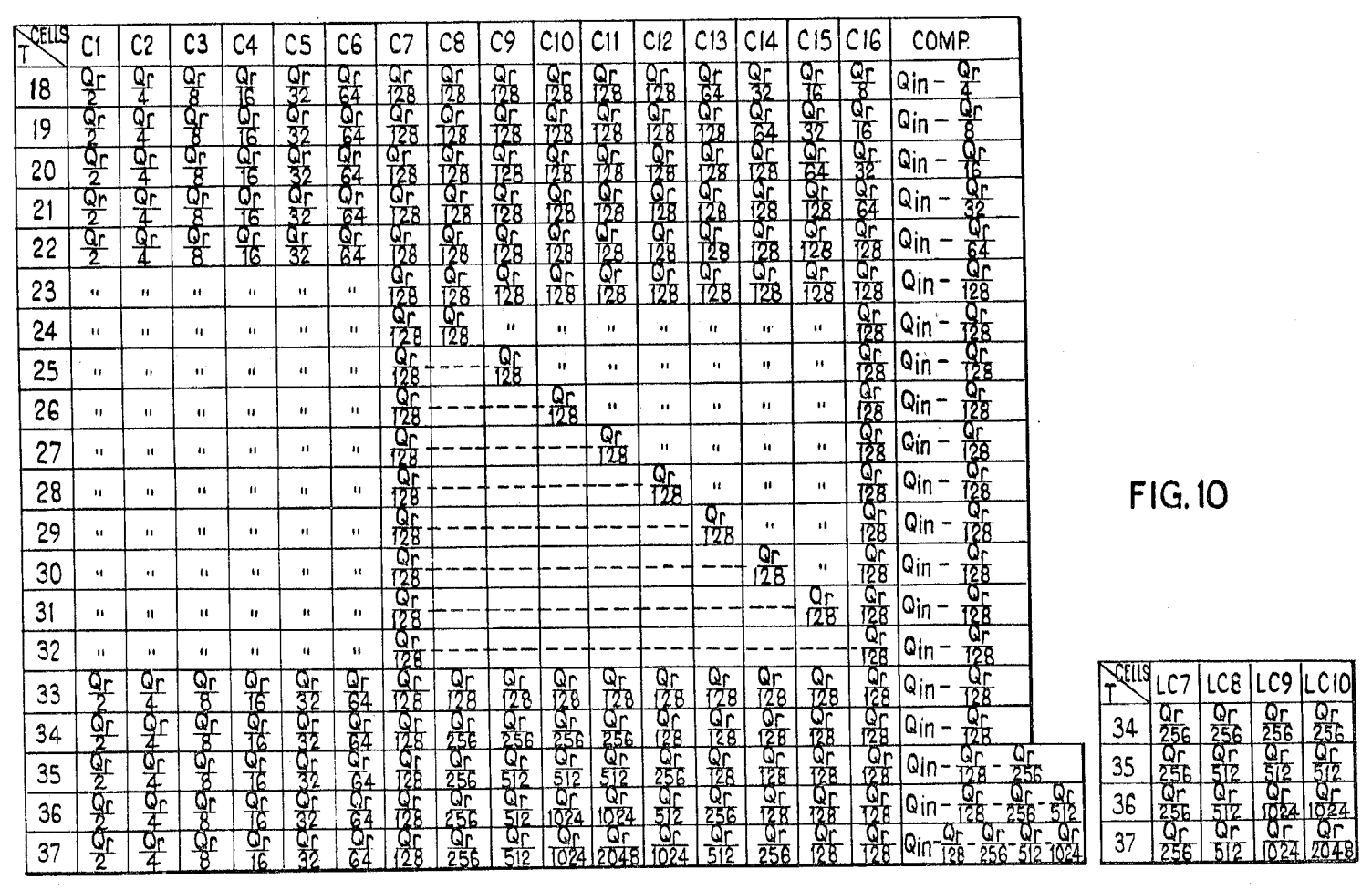
Figure 11:
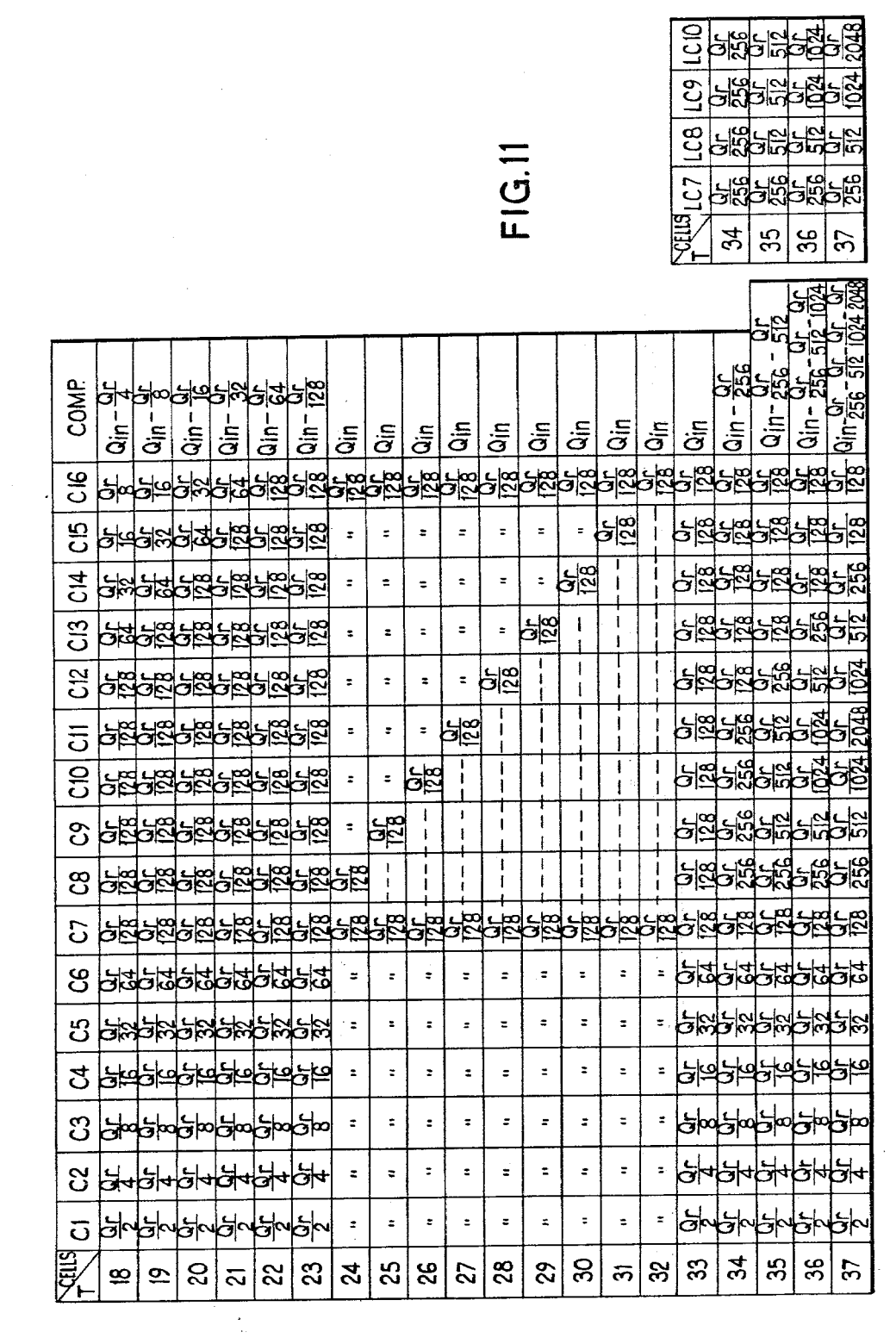

FIGS. 7 to 11 represent electric charges present in the cells C1 to C6 of the charge transfer device CTD of FIG. 1 during time intervals T18 to T37 and for various cases and represent the electric charges then applied to the comparator COMP of FIG. 1;

DESCRIPTION OF THE PREFERRED EMBODIMENTS

Figure 1:
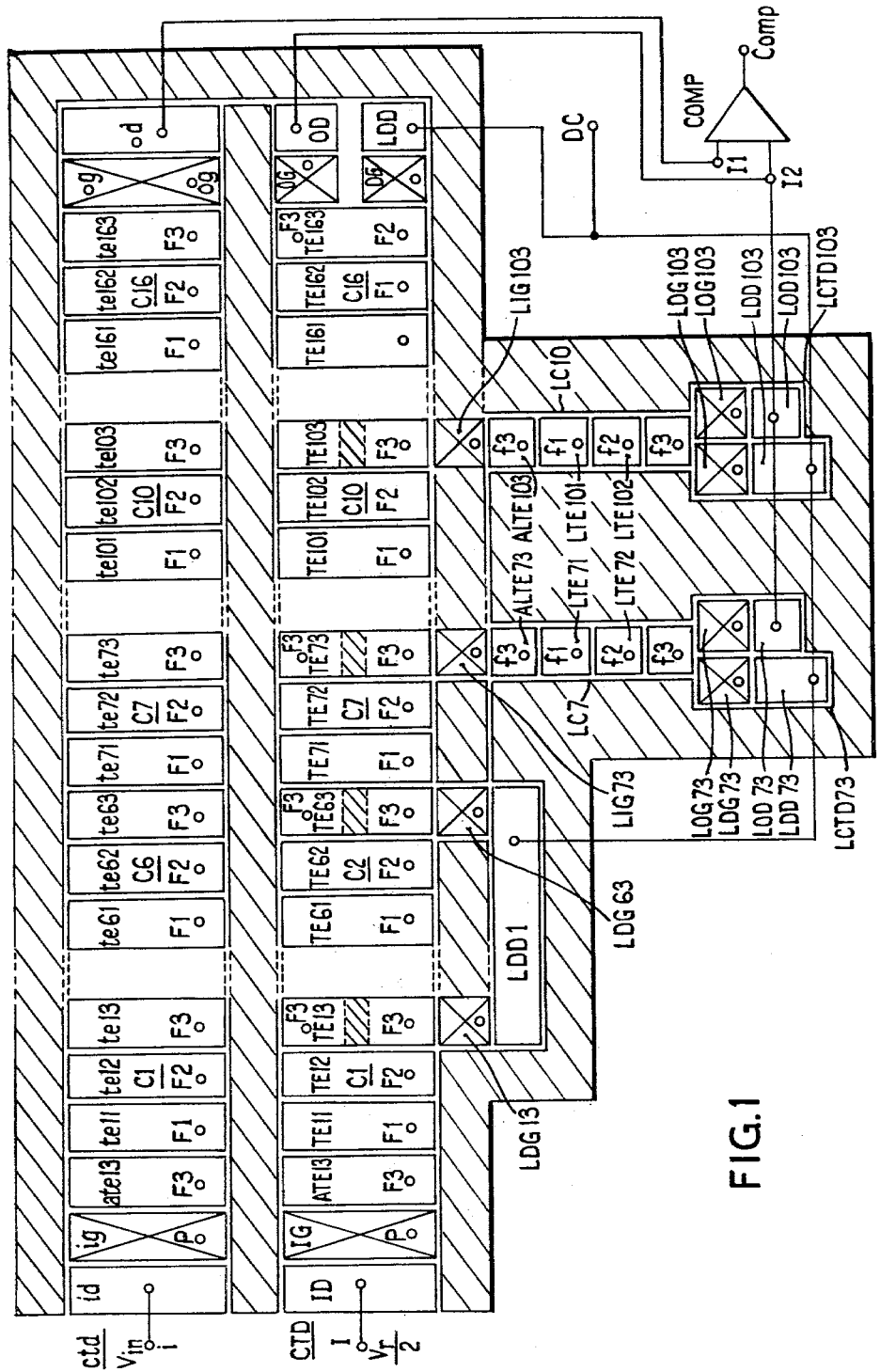
FIGS. 1 and 2 together schematically represent a signal converter and a signal generator according to the invention.
Figure 2:
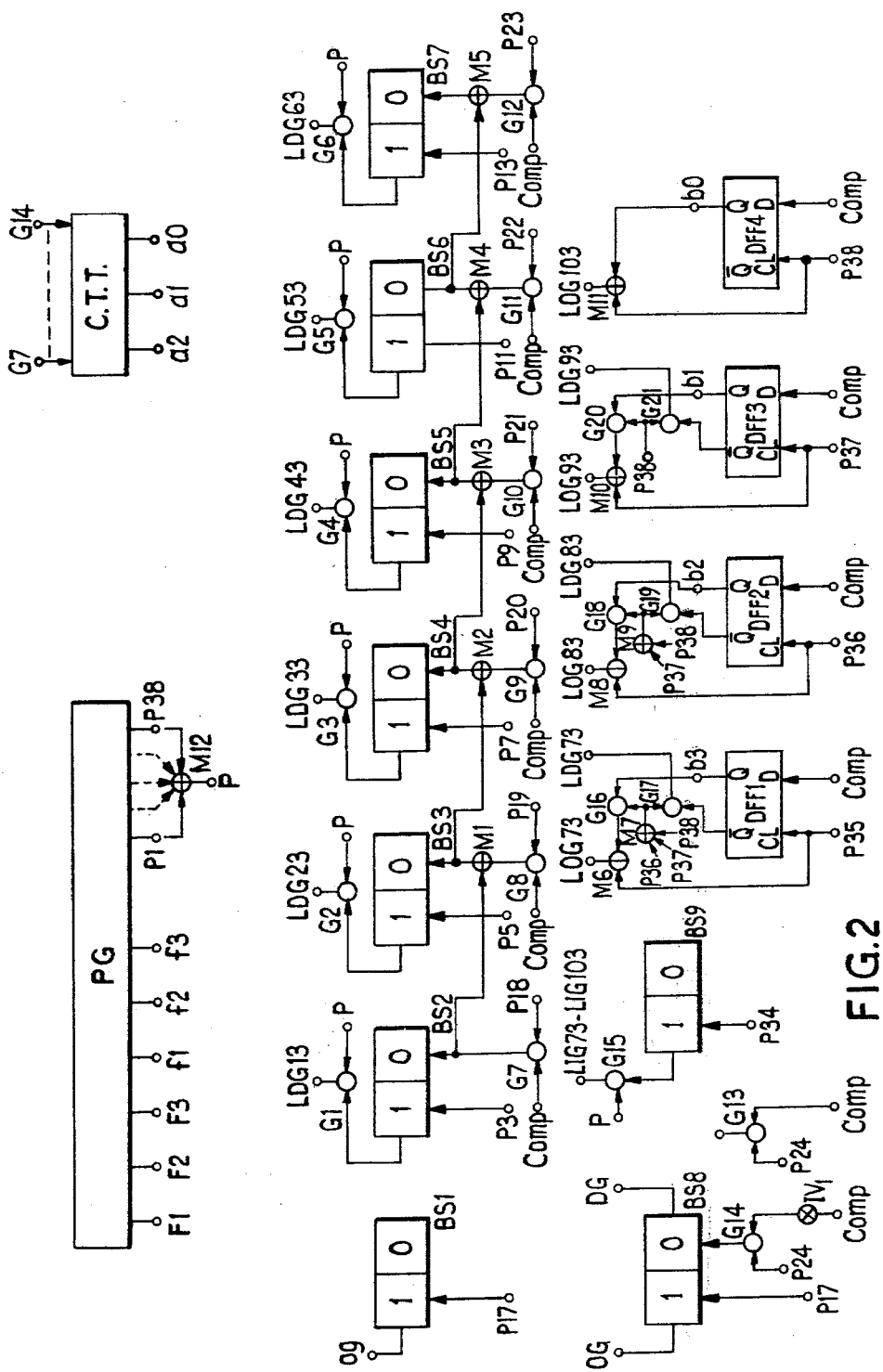

The signal converter shown in FIGS. 1 and 2 is an analog-to-digital converter able to convert a positive analogue value into a digital value according to the well known segmented A-law. This digital value has the form $a_2a_1a_0b_3b_2b_1b_0$ wherein: $a_2$, $a_1$, $a_0$ are the segment bits defining the 8 segments S1 to S8 of this A-law; $b_3$, $b_2$, $b_1$, $b_0$ are the mantissa bits defining the 16 quantums $q_1$ to $q_{16}$ in each of these segments.

This analog-to-digital converter includes two charge transfer devices ctd and CTD shown in FIG. 1 and a control device associated therewith and mainly represented in FIG. 2.

This control device (FIG. 2) includes a pulse generator PG, a code translation circuit CTT, bistable devices BS1 to BS9, D-flipflops DFF1 to DFF4, AND-gates G1 to G21, OR-gates or mixers M1 to M12 and inverter IV1. The means to reset PG, CTT, BS1-BS9 and DFF1-DFF4 to their rest condition are not shown.

The pulse generator PG generates at its outputs F1 to F3 three correspondingly-named control pulse waveforms F1 to F3 (FIGS. 3 to 5) which are time-shifted by one third T/3 of a period or time interval T and which are used for controlling the direct charge transfer in the charge transfer devices ctd and CTD (FIG. 1), as will be explained later. At its outputs f1 to f3 the pulse generator PG further generates three correspondingly-named control pulse waveforms f1 to f3 which are time-coincident with F1 to F3, respectively, but which have a higher amplitude, although this does not appear from FIGS. 3 to 5. The control pulse waveforms f1 to f3 are used for controlling the lateral charge transfer in the lateral charge transfer devices LCTD73 to LCTD103 forming part of the charge transfer device CTD, as will also be explained later. Finally, the pulse generator PG generates at its outputs P1 to P38 correspondingly-named sampling pulses P1 to P38 which appear at the output of the mixer M12 as a series P of 38 sampling pulses. These sampling pulses are synchronized with the pulses of the control pulse waveforms F1 to F3 and f1 to f3. Indeed, the rear edges of the pulses P1 to P38 occur in the center of the pulses of the control pulse waveforms F3 and f3 (FIGS. 3,4). The code translation circuit CTT is able to translate an input code applied to its inputs by the gates G7 to G14 into the segment codes 111; 110; 101; 100; 011; 010; 001; 000 associated to the segments S8 to S1 of the A-law respectively. This happens according to the following table:

| input code | | | | | | | | segment codes | | |
|---|---|---|---|---|---|---|---|---|---|---|
| G7 | G8 | G9 | G10 | G11 | G12 | G13 | G14 | a2 | a1 | a0 |
| 1 | 0 | 0 | 0 | 0 | 0 | 0 | 0 | 1 | 1 | 1 |
| 0 | 1 | 0 | 0 | 0 | 0 | 0 | 0 | 1 | 1 | 0 |
| 0 | 0 | 1 | 0 | 0 | 0 | 0 | 0 | 1 | 0 | 1 |
| 0 | 0 | 0 | 1 | 0 | 0 | 0 | 0 | 1 | 0 | 0 |
| 0 | 0 | 0 | 0 | 1 | 0 | 0 | 0 | 0 | 1 | 1 |
| 0 | 0 | 0 | 0 | 0 | 1 | 0 | 0 | 0 | 1 | 0 |
| 0 | 0 | 0 | 0 | 0 | 0 | 1 | 0 | 0 | 0 | 1 |
| 0 | 0 | 0 | 0 | 0 | 0 | 0 | 1 | 0 | 0 | 0 |

The bits $b_3$, $b_2$, $b_1$ and $b_0$ of the mantissa or quantum $b_3b_2b_1b_0$ of each of these segments are provided by the Q-outputs of the D-flipflops DFF1 to DFF4, respectively.

The charge transfer device ctd (FIG. 1) comprises:
an input diode electrode id having an input terminal i used for applying an input signal Vin thereto;
an input gate electrode ig having a control terminal P connected to the like-named output P of the mixer M12 associated with the pulse generator PG;
cells c1 to c16 each controlled by the charge transfer control waveforms F1 to F3. Cell c1 comprises four transfer electrodes or stages ate 13, te11, te12, te13, ate13 being an auxiliary transfer electrode, and each of the cells c2 to c16 comprises three transfer electrodes or stages. For instance, the cells c6, c7, c10 and c16 comprise the transfer electrodes te61, te62, te63; te71, te72, te73; te101, te102, te103; and te161, te162, te163, respectively. The electrodes te11, ..., te61, ..., te101, ..., te161; te12, ..., te62, ..., te102, ..., te162; and ate 13, ..., te63, ..., te103, ..., te163 have control terminals connected to the outputs F1, F2 and F3 of the pulse generator PG, respectively;

an output gate electrode og with a control terminal og connected to the like-named 1-output og of the bistable device BS1 (FIG. 2); and finally an output diode electrode od with an output terminal connected to an input I1 of a comparator COMP having an output terminal comp which is connected to the control device of FIG. 2.

The charge transfer device CTD comprises:

an input diode electrode ID with an input terminal I;

an input gate electrode IG with a control terminal P connected to the like-named output P of the mixer M12 associated with the pulse generator PG;

cells C1 to C16 each controlled by the charge transfer control waveforms F1 to F3. These cells are similar to the cells c1 to c16 of the ctd and are controlled in a like manner, except for the fact that the elements below the third transfer electrodes of the cells C1 to C10 are divided in two like halves by a small diffusion;

output gate electrode OG with control terminal OG connected to the like-named 1-output OG of the bistable device BS8 (FIG. 2);

a drain gate electrode DG with a control terminal DG connected to the like-named 0-output DG of the bistable device BS8;

an output diode electrode OD with an output terminal connected to an input I2 of the comparator COMP;

a lateral drain diffusion LDD with a control terminal connected to a DC-voltage DC;

lateral drain gates LDG13 to LDG63 associated with the third transfer electrodes TE13 to TE63 of the cells C1 to C6 and controlled by the like-named outputs LDG13 to LDG63 of the AND-gates G1 to G6 (FIG. 2), respectively;

a lateral drain diffusion LDD1 with a control terminal connected to the DC voltage DC;

lateral charge transfer devices LCTD73 to LCTD103 which are associated with the third transfer electrodes TE73 to TE103 of the cells C7 to C10, respectively, and which each comprise: a lateral input gate electrode LIG73 to LIG103, four transfer electrodes ALTE73, LTE71, LTE72, LTE73 to ALTE103, LTE101, LTE102, LTE103; a lateral output gate electrode LOG73 to LOG103, a lateral drain gain electrode LDG73 to LDG103; a lateral output diode LOD73 to LOD103; and a lateral drain diffusion LDD73 to LDD103. The LIG73 to LIG103 are controlled by the output LIG73-LIG103 of the AND-gate G15. The electrodes LTE71 to LTE101, LTE72 to LTE102; and ALTE73, LTE73 to ALTE103, LTE103 of the lateral cells LC7 to LC10 are controlled by the charge transfer control waveforms f1 to f3, respectively. The LOG73 to LOG103 have control terminals connected to the like-named outputs LOG73 to LOG103 of the mixers M6, M8, M10, M11 (FIG. 2), respectively, while the LDG73 to LDG93 are controlled by the like-named outputs of the AND-gates G17, G19, G21. The LDG103 is not used. The lateral output diode electrodes LOD73 to LOD103 have output terminals connected to the input I2 of the comparator COMP, while the lateral drain diffusions LDD73 to LDD103 are connected to the DC voltage DC.

The comparator COMP provides a 1-output when the difference of the signals applied to its inputs I1 and I2 are positive or zero, and a 0-output when this difference is negative.

It should be noted that the shaded paths on the drawing represent stop diffusion layers.

The operation of the above described analog-to-digital converter is described hereinafter.

A positive analog input voltage Vin to be converted to a digital value according to the above mentioned segmented A-law is applied to the input terminal i of the charge transfer device ctd, while a reference voltage Vr/2 is applied to the input terminal I of the charge transfer device CTD to be compared with the input voltage Vin. The various charge transfer control waveforms F1 to F3 and f1 to f3, the sampling pulses P and the DC voltage DC are applied to the corresponding control terminals of the converter. It should be noted that the input voltage Vin, for instance, is already a sample, e.g. taken every 125 microseconds, of another input voltage which is sampled at a frequency of 8 kHz by a sample-and-hold device (not shown) and stored in the capacitor included therein. For this reason, during the operation to be described, Vin may be considered as a constant.

The converter is able:

with the help of the charge transfer device ctd and the control means associated therewith to continuously apply an electric charge Qin corresponding to Vin to the comparator input I1, from the time interval T17 on;

with the help of the charge transfer device CTD and the control means associated therewith:

to determine, during the time intervals T18 to T24, the segment to which the Vin belongs. Use is hereby made of the lateral drain gates LDG13 to LDG63 and the lateral drain diffusion LDD1 and by successively applying electric charges corresponding to the segments S8 to S1 to the comparator input I2;

to determine during the time intervals T24 to T37 the quantum to which the Vin belongs. Use is hereby made of the lateral charge transfer devices LCTD73 to LCTD103 and by applying electric charges corresponding to 8, 4, 2 and 1 segment quantums to the comparator input I2.

First the operation of the charge transfer device ctd is considered, reference being particularly made to FIGS. 1 to 3 and 6.

At the moment the input gate ig is activated by the sampling pulse P1 shortly after the start of the time interval T1 (FIG. 3) an electric charge Qin which is a measure of the input voltage Vin is formed under the auxiliary transfer electrode ate13 of the charge transfer device ctd because the latter electrode ate13 is at that moment activated by pulse 0 of the control pulse waveform f3 (FIG. 3). When this sampling pulse P1 ends, this electric charge Qin is isolated from under the input gate electrode ig. This means that the constant input voltage Vin has been sampled by the sampling pulse P1. When afterwards during the same time interval T1 the transfer electrode te11 of the ctd is activated by pulse 1 of the transfer control pulse waveform F1 (FIG. 3) this electric charge Qin is spread-out under both the transfer electrodes ate13 and te11. Subsequently, at the moment the pulse 0 of the transfer control waveform F3 ends the electric charge Qin under the transfer electrode te11 is isolated. Thus, the electric charge Qin has been transferred from under the transfer electrode ate13 to under the transfer electrode te11. In an analogous way, the electric charge Qin is transferred from under the transfer electrode te11 to under the transfer electrode te12 and then from under the latter transfer electrode te12 to under the transfer electrode te13. This electric charge is situated solely under the latter electrode at the end of pulse 1 of the transfer control waveform F2, i.e. before the start of the time interval T2.

From the above it follows, as is represented on FIG. 6, that during the time interval T1 an electric charge Qin is entered in the cell c1 of the charge coupled device ctd. During the following time interval T2 a same electric charge Qin is entered in the cell C1, while that stored in the cell c1 is transferred to the cell c2 of the ctd, etc. Finally, during the time interval T16 a same electric charge Qin is entered in the cell c1 and the electric charges Qin stored in the cells c1 to c15 are shifted into the cells c2 to c16, respectively.

Shortly after the start of the time interval T17 and by the sampling pulse P17 (FIG. 3) the bistable device BS1 (FIG. 2) is triggered to its 1-condition wherein it activates output gate og. Because at that moment an electric charge Qin is stored under the transfer electrode te163 of cell c16 this electric charge Qin then appears on the output diode od from which it is supplied to the input I1 of the comparator COMP. The sampling pulse P17 and obviously also the following sampling pulses P18 to P38 applied to the input gate ig shift contents of the charge transfer device ctd so that also during the time intervals T18 to T37 an electric charge Qin is stored on the output diode od and supplied to the input I1 of the comarator COMP (FIG. 6).

The operation of the charge transfer device CTD is now considered in detail, reference being particularly made to FIGS. 1, 2, 4 and 6.

In an analogous way as described above for the charge transfer device ctd, and at the moment the input gate IG of the CTD is activated by the sampling pulse P1, shortly after the start of the time interval T1, an electric charge QR/2 which is a measure of the reference voltage Vr/2 is formed under the auxiliary transfer electrode ATE13 of the CTD because at that moment the latter electrode ATE13 is activated by pulse 0 of the waveform F3 (FIG. 4). When this sampling pulse P1 ends, this electric charge Qr/2 is isolated from under the input gate electrode IG, and when afterwards and during the same time interval T1 the transfer electrode TE11 of the CTD is activated by pulse 1 of the waveform F1 (FIG. 4) this electric charge Qr/2 is spread-out under both the transfer electrodes ATE13 and TE13. Subsequently, at the moment the pulse 0 of the waveform F3 ends the electric charge Qr/2 under the transfer electrode TE11 is isolated. In an analogous way this electric charge Qr/2 is transferred first from under the transfer electrode TE11 to under the transfer electrode TE12 (at the end of pulse 1 of waveform F1 the charge is situated solely under this electrode) and then from under the latter transfer electrode TE12 to under the transfer electrode TE13. This happens at the start of pulse 1 of the waveform F3. Because the element under the transfer electrode is split in two like portions, an electric charge equal to Qr/4 is then present under TE13.

From the above, as represented on FIG. 6, it follows that during the time interval T1 an electric charge Qr/2 is entered in the cell C1 of the charge transfer device CTD. During the following time interval T2 an electric charge Qr/2 is entered in the cell C1 and split in two equal portions equal to Qr/2 under the transfer electrode TE13, while the electric charge Qr/2 stored in the cell C1 is transferred to the cell C2 of the CTD. Because also under the third transfer electrode of this cell C2 the electric charge is split in two equal portions, two electric charges equal to Qr/4 are present under this transfer electrode near the end of this time interval T2, the total electric charge being however equal to Qr/2 (FIG. 6).

Shortly after the start of the time interval T3 (FIG. 4) the sampling pulse P3 triggers the bistable device BS2 (FIG. 2) to its 1-condition wherein the AND-gate G1 controlling the lateral drain gate LDG13 is activated. As a consequence, sampling pulses P3 to P38 may be supplied to this lateral drain gate LDG13. Because the lateral drain diffusion LDD1 is continuously activated by the DC voltage applied thereto the sampling pulse P3 has the effect that:

the electric charge Qr/4 stored in the lower half of the element situated under the transfer electrode TE13 is drained away, so that a total electric charge equal to Qr/4 remains under this electrode;

a new electric charge Qr/2 is entered in the cell C1 and stored under the auxiliary transfer electrode ATE13, which is still activated by the pulse 2 of the waveform F3. All this happens before the pulses 3 of the waveform F1, F2 and F3 are applied to the CTD. By these pulses the electric charges in the CTD are shifted so that at the end of the time interval T3 electric charges Qr/2, Qr/4 and Qr/2 are stored in the cells C1, C2 and C3, respectively, as represented on FIG. 6.

In an analogous way, during the time interval T4 a new electric charge Qr/2 is stored in cell C1, an electric charge Qr/4 is stored in cell C2, an electric charge Qr/4 is stored in cell C3, and an electric charge Qr/2 is stored in cell C4. It should be noted that the electric charge Qr/4 in cell C2 is split in two like portions equal to Qr/8.

Shortly after the start of the time interval T5 the sampling pulse P5 triggers the bistable device BS3 to its 1-condition wherein it enables AND-gate G2 which controls the lateral drain gate LDG23 (not shown) associated with the third electrode of cell C2. As a consequence, the samplling pulses P5 to P38 may be supplied to this lateral drain gate LDG23. Because the lateral drain diffusion LDD1 is continuously activated the sampling pulse P5 has the effect that:

the electric charge Qr/4 stored in the lower half of the element situation under the transfer electrode TE13 of cell C1 is drained away via LDG13 so that a total electric charge equal to Qr/4 remains under this electrode;

the electric charge Qr/8 stored in the lower half of the element situated under the transfer electrode TE23 (not shown) of cell C2 is drained away via LDG23 so that a total electric charge equal to Qr/8 remains under this electrode;

a new electric charge Qr/2 is entered in the cell C1 and stored under the auxiliary transfer electrode ATE13 which is still activated by the pulse 4 of the waveform F3. All this happens before the pulses 5 of the waveforms F1, F2 and F3 are applied to the CTD. By these pulses the electric charges in the CTD are shifted, so that at the end of the time interval T5 electric charges Qr/2 Qr/4 Qr/8 Qr/4 and Qr/2 are stored in the cells C1 to C5, respectively, as shown on FIG. 6.

In a similar way, as described above, the following happens during time interval T6 electric charges are drained via the lateral drain gates LDG13 and LDG23 (not shown);

during time interval T7 the bistable device BS4 is triggered to its 1-condition wherein it activates AND-gate G3 controlling the lateral drain gate LDG33 (not shown) associated with the third transfer electrode TE33 (not shown) of cell C3. As a consequence, half of the electric charge under this electrode is drained away. The same happens with the electric charges in the cells C1 and C2; etc.

during time interval T13 the bistable device BS7 is triggered to its 1-condition wherein it activates AND-gate G6 controlling the lateral drain gate LDG63 associated with the third transfer electrode TE63 of cell C6. As a consequence, half of the electric charge under this electrode is drained away and the same is true for the electric charges in the cells C1 to C5. Hence, from the time interval T13 on the electric charges Qr/2 entered in the CTD are successively divided by two in all the cells C1 to C6, as shown in FIG. 6.

At the end of the time interval T16 an electric charge Qr/2 is stored under the third electrode TE163 of the cell C16 from the start of the pulse 16 of the waveform F3 on. Shortly after the start of the time interval T17 and by the sampling pulse P17 (not shown) the bistable device BS8 is triggered to its 1-condition whereby the output gate OG is enabled and the drain gate DG is inhibited. Because an electric charge Qr/2 is then stored under the transfer electrode TE163 of cell C16 this electric charge Qr/2 then appears on the output diode OD from which it is supplied to the input I2 of the comparator COMP.

From the above it follows that during time interval T17 electric charges Qin and Qr/2 are formed on the output diodes od and OD and supplied to the input terminals I1 and I2 of the comparator COMP. Although the electric charges Qin and Qr/2 are applied to separate inputs of this comparator, in the FIGS. 6 to 11 the charge applied to the comparator is represented by Qin-Qr/2 for simplicity reasons. This is always done in what follows.

Various cases are now considered, reference being particularly made to FIGS. 1, 2, 5 and 7 to 11.

When the input voltage Vin is equal to or larger than half the reference voltage, i.e. Vr/2, and therefore belongs to segment 8 of the A-law curve, the output comp of the comparator COMP is activated (1) so that the bistable device BS2 is then reset to its 0-condition by the sampling pulse P18 because this pulse then activates the output of AND-gate G7. As a consequence, the AND-gate G1 is disabled and the output LDG13 thereof is de-activated so that electric charges can no longer be drained away via the lateral drain gate LDG13 and the LDD1. Also due to the output of AND-gate G7 being activated the outputs of the mixers M1 to M5 are successively activated, as a consequence of which the bistable devices BS3 to BS7 are reset to their 0-condition so that electric charges also can no longer be drained away via the lateral drain gates LDG23 to LDG63 and the LDD1. Hence, during the successive time intervals T18 to T33 electric charges equal to Qr/2 are successively applied to the CTD and are no longer divided by 2 in the cells C1 to C6, so that the contents thereof vary as indicated on FIG. 7. Hereby the condition of the output comp of the comparator COMP obviously does not change. At the end of the time interval T33 the electric charges stored in the cells C1 to C16 all are equal to Qr/2, i.e. to a value corresponding to the beginning of segment 8, while the electric charges applied to the comparator inputs are equal to Qin and Qr/2, respectively.

It should be noted that as soon as the output of the gate G7 is activated, the code translation circuit CTT provides an output a2a1a0=111 indicating that the input voltage Vin belongs to segment S8 having code a2a1a0=111.

When, on the contrary, the input voltage Vin is smaller than half the reference voltage Vr/2 and, therefore, belongs to one of the segments S1 to S7, the output comp of the comparator COMP remains de-activated (0), so that the following sampling pulse P18 has no influence on the condition of the bistable device BS2 nor of the other bistable devices BS3 to BS6. Consequently, during the time interval T18 the contents of the CTD vary as indicated on FIG. 8 and during this time interval an electric charge equal to Qr/4 is supplied to the input I2 of the comparator COMP. An electric charge equal to Qin is simultaneously supplied to the input I1 thereof.

When the input voltage Vin is equal to or larger than Vr/4 and, therefore, belongs to segment S7 the output of the comparator COMP is activated (1) so that the bistable device BS3 is then reset to its 0-condition by the sampling pulse P19 which then activates the output of AND-gate G8. As a consequence, the AND-gate G2 is inhibited and the output LDG23 thereof is de-activated so that electric charges can no longer be drained away via the lateral drain gate LDG23 and the LDD1. Also, due to the output of AND-gate G8 being activated, the outputs of the mixers M1 to M5 are successively activated, as a consequence of which the bistable devices BS4 to BS7 are reset to their 0-condition so that electric charges can also no longer be drained away via the lateral drain gates LDG33 to LDG63 and the LDD1. Hence, during the successive time intervals T19 to T33 electric charges equal to Qr/2 are successively entered into the CTD and are only divided by 2 in cell C1 so that the contents of the CTD vary as indicated on FIG. 8. Hereby the condition of the output comp of the comparator COMP obviously does not change. At the end of the time interval T33 the electric charges stored in the cells C2 to C16 all are equal to Qr/4, i.e. to a value corresponding to the beginning of segment 7, while the electric charge supplied to the inputs of the comparator COMP are equal to Qin and Qr/4, respectively. It should be noted that as soon as the gate G8 is activated the code translation circuit CTT provides the output 110 indicating that the input voltage Vin belongs to segment S7 having code a2a1a0=110.

When, on the contrary, the input voltage Vin is smaller than Vr/4 and, therefore, belongs to one of the segments S1 to S6, the output comp of the comparator COMP remains deactivated (0), so that the following sampling pulse P19 has no influence on the condition of the bistable device BS3 nor of the bistable devices BS4 to BS7. Consequently, during the time interval T19 the contents of the CTD vary as indicated on FIG. 9, and during this time interval an electric charge equal to Qr/8 is supplied to the input I2 of the comparator COMP. An electric charge equal to Qin is applied to the input I1 thereof.

In a similar way, as described above the following happens:

when Vin−Vr/8≧0 thus indicating that Vin belongs to segment S6, the output comp of the comparator COMP is activated (1) so that the bistable devices BS4 to BS7 are reset to their 0-condition by the sampling pulse P20, the AND-gate G9 being activated. As a consequence, electric charges can no longer be drained away via the lateral drain gates LDG33 to LDG63. Therefore, during the successive time interval T20 to T33 electric charges equal to Qr/2 are entered into the CTD and are only divided by 2 in the cells C1 and C2 so that the contents of the CTD vary as indicated on FIG. 9. Hereby the condition of the output comp of the comparator COMP obviously does not change. At the end of the time interval T33 the electric charges stored in the cells C3 to C16 all are equal to Qr/8, i.e. to the value corresponding to the beginning of segment S6, while the electric charges supplied to the inputs of the comparator COMP are equal to Qin and Qr/8, respectively. It should be noted that as soon as the gate G9 is activated the CTT provides the output 101 indicating that Vin belongs to the segment S6 with code a2a1a0=101;

when $Vin - Vr/8 < 0$, thus indicating that Vin belongs to one of the segments S1 to S5, during the time interval T20 an electric charge euqal to Qr/16 is applied to the input I2 of the comparator COMP, the condition of the bistable devices BS2 to BS8 remaining unchanged;

when $Vin - Vr/16 \geq 0$ thus indicating that Vin belongs to the segment S5 the lateral drain gates LDG43 to LDG63 are inhibited, but the LDG13 to LDG33 remain activated. This happens during time interval T21. Hence, at the end of time interval T33 the electric charges stored in the cells C4 to C16 all are equal to Qr/16, i.e. the value corresponding to the beginning of segment 5, while the electric charges supplied to the inputs of the comparator COMP are equal to Qin and Qr/16 respectively. It should be noted that the segment code is a2a1a0=100;

when $Vin - Vr/16 < 0$, thus indicating that Vin belongs to one of the segments S1 to S4, during time interval T21 an electric charge equal to Qr/32 is applied to the input I2 of the comparator COMP;

when $Vin - Vr/32 > 0$, thus indicating that Vin belongs to the segment S4, during time interval T22 the lateral drain gates LDG53 and LDG63 are inhibited, but the LDG13 to LDG43 remain activated. Consequently, at the end of time interval T33 the electric charges stored in the cells C5 to C16 all are equal to Qr/32, i.e. to the value corresponding to the beginning of segment S4, while the electric charges applied to the inputs of the comparator COMP are equal to Qin and Qr/32, respectively. The segmment code is a2a1a0=011;

when $Vin - Vr/32 < 0$, thus indicating that Vin belongs to one of the segments S1 to S3, during time interval T21 an electric charge equal to Qr/64 is applied to the input I2 of the comparator COMP;

when $Vin - Vr/64 \geq 0$, thus indicating that Vin belongs to the segment S3, during time interval T23 the lateral transfer gate LDG63 is inhibited, following the occurrence of the sampling pulse P23, but the LDG13 to LDG53 remain enabled. Consequently, at the end of time interval T33 the electric charges stored in the cells C6 to C16 all are equal to Qr/64, i.e. to the value corresponding to the beginning of the segment S3, while the electric charges applied to the inputs of the comparator COMP are equal to Qin and Qr/64, respectively. The segment code provided at the output of the CTT is equal to a2a1a0=010;

when $Vin - Vr/64 < 0$, thus indicating that Vin belongs to one of the segments S1 and S2, during time interval T23 an electric charge equal to Qr/128 is applied to the input I2 of the comparator COMP;

when $Vin - Vr/128 \geq 0$, thus indicating that Vin belongs to the segment S2, all the LDG13 to LDG63 remain activated. The gate G13 is activated by the sampling pulse P24 so that the CTT provides the output a2a1a0=001. Consequently, at the end of the time interval T33 the electric charges stored in the cells C7 to C16 all are equal to Qr/128, i.e. to the value corresponding to the beginning of the segment S2, while the electric charges supplied to the inputs of the comparator COMP are equal to Qin and Qr/128, respectively (FIG. 10).

when $Vin - Vr/128 < 0$ (FIG. 11), thus indicating that Vin belongs to the segment S1, all the LDG13 to LDG63 remain activated. During time interval T24 and more particularly by the sampling pulse P24 activating the output of gate G14 because the comparator output is on O, the bistable device BS8 is reset to its O-condition whereby the output gate OG is inhibited and the drain gate DG is enabled. Electric charges can thus be drained away via the gate. Consequently, during the time intervals T24 to T33 the electric charges which all are equal to Qr/128 are prevented from being transferred on the output diode OD so that only the electric charge Qin is supplied to the comparator COMP. The CTT provides the output a2a1a0=000.

From the above it follows that for each of the cases just considered, at the end of time interval T33 the electric charges stored in the cells C7 to C16 all have a value equal to Qr/2, Qr/4, . . . , Qr/128 corresponding to the beginning of the segments S8 to S2 to which the input voltage Vin belongs, while the electric charge applied to the input I2 of the comparator COMP also has this value. The code a2a1a0 of this segment is provided by the CTT.

However, for the segment S1 the electric charges stored in the cells C7 to C16 are the same as for segment S2, but the electric charge applied to the input I2 of the comparator COMP is O.

It will now be described how for the Vin and during the time intervals T34 to T37 the mantissa or quantum code b3b2b1b0 is obtained for each of the above considered segments S1 to S8. These quantums are indicated by q1 to q16 having, respectively, the codes b3b2b1b0=1111 to b3b2b1b0=0000.

By the sampling pulse P34 (FIG. 5) the bistable device BS9 is triggered to its 1-condition wherein the AND-gate G15 is activated. This gate allows the pulses P34 to P38 to be supplied to the lateral input gate electrodes LIG731 to LIG1031 associated with the lower halves of the elements situated below the third transfer electrodes TE73 to TE103 of the CTD and belonging to the lateral charge transfer devices LCTD73 to LCTD103. Because these transfer electrodes TE73 to TE103, activated by the pulse 33 of the control pulse waveform F3, are then at a lower voltage than the lateral transfer electrodes ALTE73 to ALTE103 which are activated by the pulse 33 of the control pulse waveform f3, the electric charges located under the lower halves of the elements situated under the transfer electrodes TE73 to TE103 are spread-out under the lateral input gates LIG73 to LIG103 and the lateral transfer electrodes ALTE73 to ALTE103 of the LCTD73 to LCTD103, respectively. At the end of the sampling pulse P34 these electric charges are completely located under the latter electrodes, these electric charges have the same value equal to a corresponding one of the values Qr/4, Qr/8, . . . , Qr/256, Qr/256 depending on the segment S8, S7, . . . , S2, S1 to which Vin belongs, because the total electric charge under the whole transfer electrodes TE73 to TE103 are all the same and have a value equal to a corresponding one of the values Or/2, Or/4, ..., Qr/128, Qr/128.

The electric charge deviated into the cells LC7 to LC10 of the LCTD73 to LCTD103 are shown in FIGS. 7 to 11. It is clear that at the end of pulse P34 also the electric charges located under the third electrodes TE73 to TE103 of the CTD all are the same and have a value equal to a corresponding one of the values Qr/4, ..., Qr/256, Qr/256.

By the pulses 34 of the control pulse waveforms f1 to f3 controlling the lateral transfer electrodes of the LCTD73 to LCTD103 these electric charges Qr/4, ..., Qr/256 are transferred to these lateral charge transfer devices. Likewise, by the pulses 34 of the control pulse waveforms F1 to F3 controlling the transfer electrodes of the charge transfer device CTD the electric charges contained therein are shifted by one step so that the electric charges at the end of time interval T34 have values as indicated on the FIGS. 7 to 11.

Therefrom it follows that the electric charge applied to the comparator COMP at the end of the time interval T34 is the same as at the end of the time interval T33 so that the comparator output comp remains on 1.

For instance, when Vin was found to belong to the segment S8 (FIG. 7), at the end of the time interval T34 the contents of the cells C7 to C10 are Qr/2, Qr/4, Qr/4, Qr/4 respectively, while those of the cells LC7 to LC10 are Qr/4, Qr/4, Qr/4, Qr/4, respectively. Electric charges equal to Qin and Qr/2 are applied to the inputs of the comparator COMP respectively.

By the sampling pulse P35 (FIG. 5) generated shortly after the start of the time interval T35:

electric charges equal to half the total electric charge stored in the cells C7 to C10 of the CTD are laterally deviated therefrom and stored under the electrodes ALTE73 to ALTE103 of the cells LC7 to LC10 of the LCTD73 to the LCTD 103, respectively, in a similar way as described above for the sampling pulse P34. These electric charges are shown on FIGS. 7 to 11 (time interval T35);

the lateral output gate LOG73 forming part of the LCTD73 is enabled for the duration of the pulse P35 via the OR-gate M6 so that the electric charge, present under the third transfer electrode LTD73 of the LCTD73 since the end of time interval T34, i.e. Qr/4, ..., Qr/256, is transferred under the lateral output diode LOD73. From the later diode it is applied to the input I2 of the comparator COMP so that the electric charges present at this input I2 shortly after the start of the time interval T35 is equal to Qr/2+Qr/4, ..., Q/128+Q/256, Qr/256 when the Vin belongs to segment S8, ..., S1, respectively. As a consequence, the condition of the output comp of this comparator COMP becomes 0 or remains on 1 depending on the Vin belonging to the 8 upper (q9-q16) or 8 lower (q1-q8) quantums of the corresponding segment. In the former case, the electric charge Qr/4, ..., Qr/256 should be continued to be applied via the lateral output diode LOD73 to the comparator COMP during the remaining time intervals T36-T37, whereas it should be removed in case the comparator output comp becomes 0. For this reason, the condition of this output comp is registered in the D-flipflop DFF1 by the rear edge of the sampling pulse P35:

in case the comparator output comp remains on 1 (quantums q9-q16) this flipflop DFF1 is triggered to its 1-condition whereby the AND-gate G16 is activated so that the sampling pulses P36 to p38 appearing at the output of OR-gate M7 during the time intervals T36 to T38 will be supplied to the LOG73 via this gate and the OR-gate M6 and that the above electric charges Qr/4, ..., Qr/256 will then be applied to the comparator;

when the comparator output comp becomes 0 (quantums q1-q8) the D-flipflop DFF1 remains in its 0-condition so that the LOG73 is inhibited and the AND-gate G17 is enabled. Consequently, the sampling pulses P36 to P38 generated during the T36 to T38 will thus be supplied to the lateral drain gate LDG73 via this gate G17 so that the above electric charges Qr/4, ..., Qr/256 will then not be applied to the comparator.

It is clear from the above that the Q-output b3 of the D-flipflop DFF1 produces the bit b3 of the quantum code b3b2b1b0.

By the pulses 35 (FIG. 5) of the control pulse waveforms F1 to F3 and f1 to f3 the electric charges are then shifted in the CTD and in the LCTD73 to the LCTD103 so that at the end of the time interval T35 the contents of these charge transfer devices are as shown on FIGS. 7 to 11.

Figure 7:
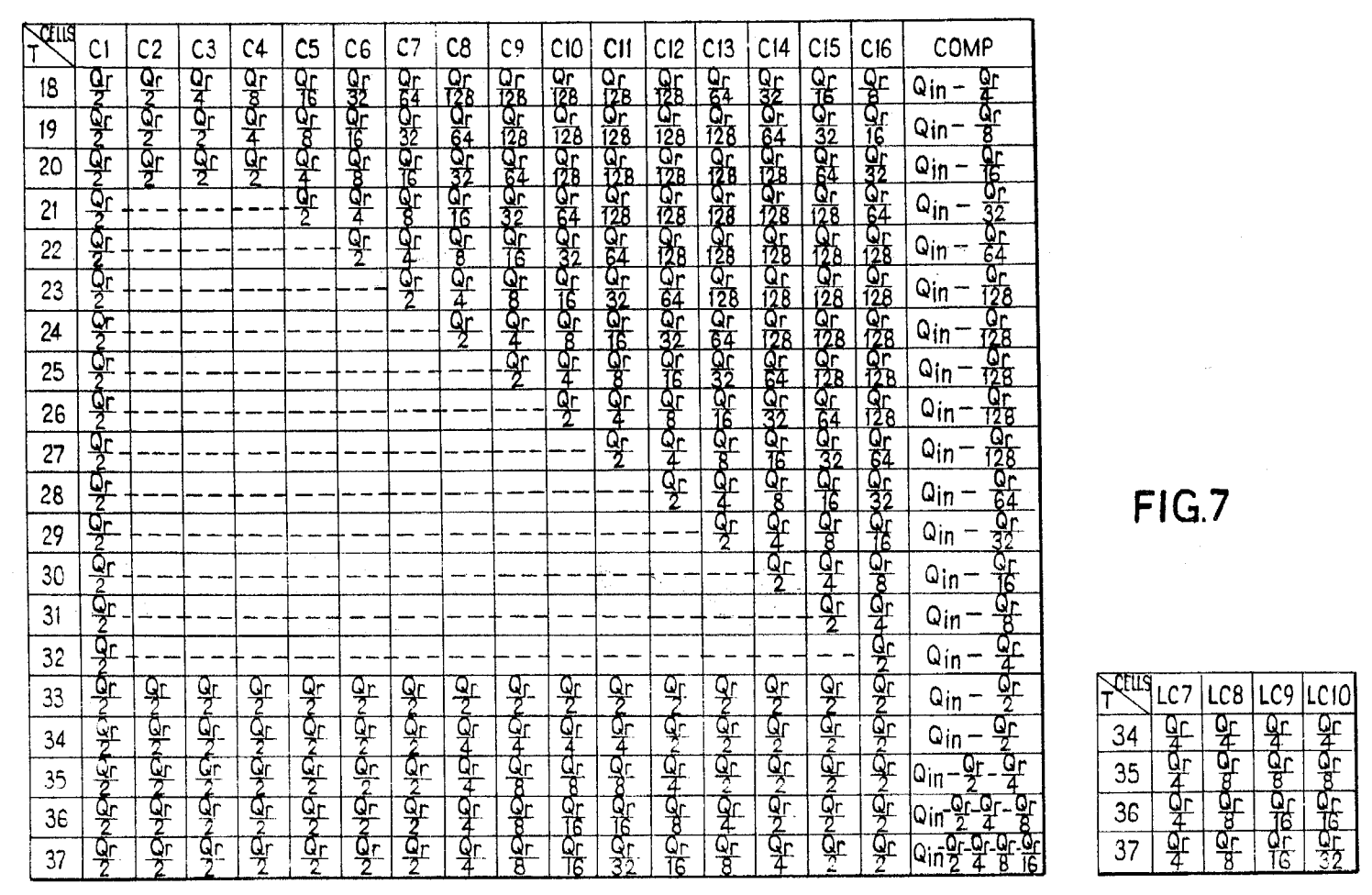
Figure 9:
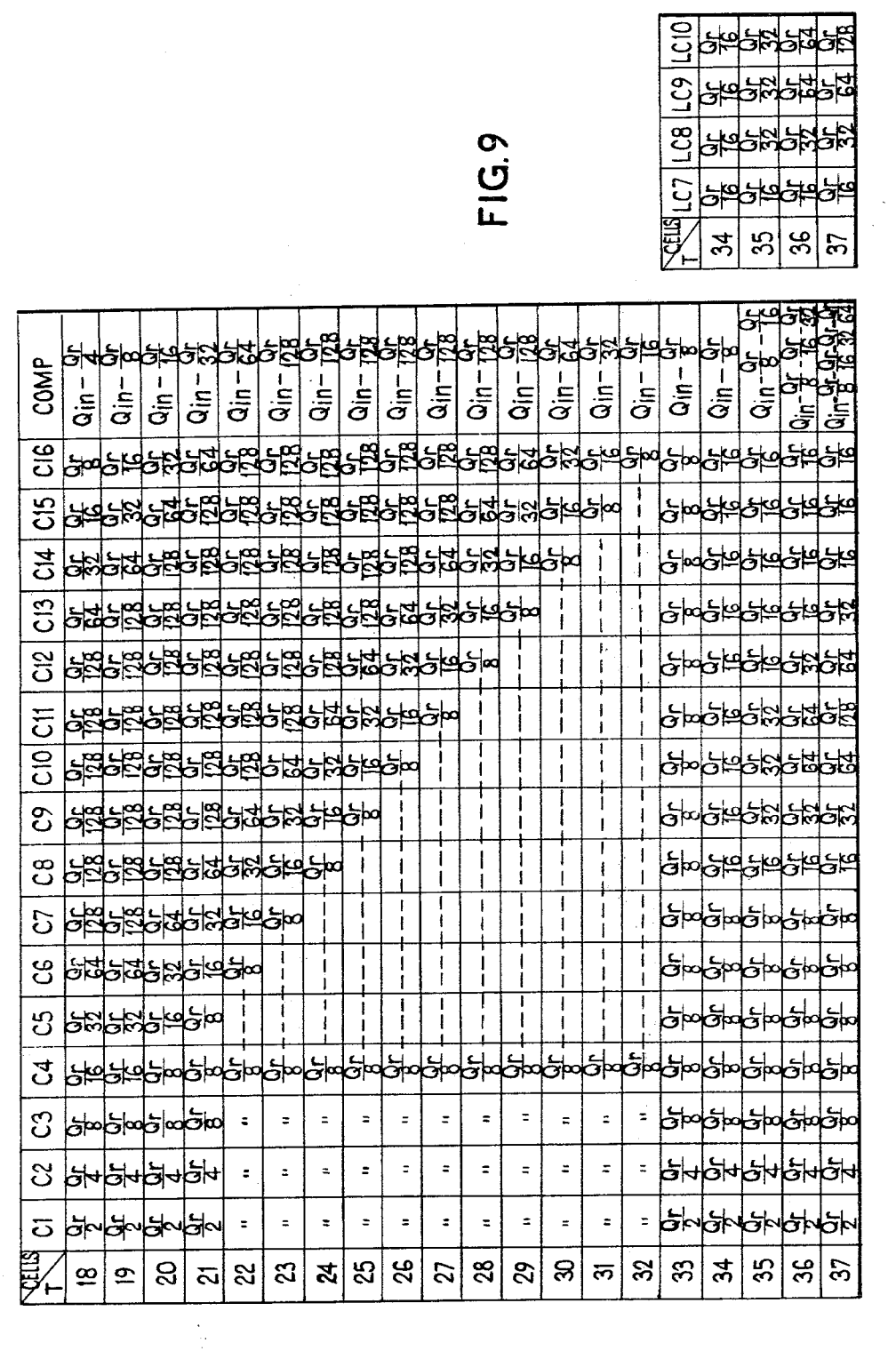

For instance, when earlier Vin was found to belong to one of the upper quantums q9-q16 of the segment S8, at the end of the time interval T35 the electric charges stored in the cells C7 to C10 are Qr/2, Qr/4, Qr/8, Qr/8, respectively, those stored under the third electrodes LTE73 to LTE103 of the cells LC7 to LC10 are Qr/4, Qr/8, Qr/8, Qr/8, respectively, and the electric charge applied to the inputs of the comparator COMP are equal to Qin and Qr/2+Qr/4, respectively (FIG. 7). For the other FIGS. 8 to 11 it is also supposed that the Vin belongs to one of the quantums q9 to q16.

By the sampling pulse P36 (FIG. 5) generated shortly after the start of the time interval T36:

electric charges equal to half the electric charges stored in the cells C7 to C10 of the CTD at the end of the time interval T35 are laterally deviated therefrom and stored under the electrodes ALTE73 to ALTE103 of the cells LC7 to LC10 of the LCTD73 to the LCTD103, respectively, in a similar way as described above for the sampling pulse P34. These electric charges are shown on FIGS. 7 to 11 (time interval T36):

when the comparator output comp was previously found to be on 1 (quantums q9-q16) the LOG73 is activated via the OR-gate M7, the AND-gate G16 and the OR-gate M6 for the duration of the pulse P36, whereas when this output was previously found to be on 0 (quantums q1-q8) the LDG73 is activated for the duration of this pulse P36. Consequently, the electric charge (Qr/4, ..., Qr/256) present under the electrode LTE73 since the end of the time interval T35 either is continued to be applied to the comparator input I2 or is drained away, no electric charge being then applied to this input;

the lateral output gate LOG83 forming pat of the LCTD83 is activated for the duration of the pulse P36 via the OR-gate M8 so that the electric charge (Qr/8, ..., Qr/512) present under the third transfer electrode LTE83 of the LCTD83 (not shown) at the end of the time interval T35 is transferred under the output diode LOD83 from which this charge is supplied to the input I2 of the comparator COMP. As a consequence, the electric charge applied to the input I2 is equal to the following values for the segments S8 to S1 and depending on the fact that the input voltage Vin belongs to the quantums q9 to q16 (LOG73 activated) or q1 to q8 (LDG73 activated) of these segments:

| S8 | $\frac{Qr}{2} + \frac{Qr}{4} + \frac{Qr}{8}$ or $\frac{Qr}{2} + \frac{Qr}{8}$ |
|---|---|
| . | |
| . | |
| S2 | $\frac{Qr}{128} + \frac{Qr}{256} + \frac{Qr}{512}$ or $\frac{Qr}{128} + \frac{Qr}{512}$ |
| S1 | $\frac{Qr}{256} + \frac{Qr}{512}$ or $\frac{Qr}{512}$ |

In each of these cases the condition of the output comp of the comparator COMP is 1 or 0 depending on the Vin belonging to the set of quantums q13–q16, q5–q8 or to the set of quantums q9–q12, q1–q4 of the corresponding segment. In the former case, the electric charge Qr/8, . . . , Qr/512 should be continued to be applied via the lateral output diode LOD83 to the comparator COMP during the remaining time intervals, whereas this charge should be removed in case the comparator output comp is on 0. For this reason, the condition of this output is registered in the D-flipflop DFF2 by the rear edge of the sampling pulse P35:

in case the comparator output comp is on 1 (quantums q13–q16, q5–q8) this flipflop DFF2 is triggered to its 1-condition whereby the AND-gate G18 is activated, so that the sampling pulses P37 and P38 are allowed to be applied to the LOG83 via this gate and the OR-gate M8;

when the comparator output comp is on 0 (quantums q9–q12; q1–q4) the D-flipflop DFF2 remains in its 0-condition so that the LOG83 is inhibited and the AND-gate G19 is activated, the above sampling pulses P37 and P38 being thus allowed to be supplied to the lateral drain gate LDG73 via this gate G19 and during the time intervals T37 and T38.

It follows from the above that the condition of Q-output b2 of the D-flipflop DFF2 indicates the value of the bit b2 of the quantum code b3b2b1b0. By the pulses 36 (FIG. 5) of the control pulse waveforms F1 to F3 and f1 to f3 the electric charges are then shifted in the CTD and in the LCTD73 to the LCTD103 so that at the end of the time interval T36 the contents of these charge transfer devices are as shown on FIGS. 7 to 11. For instance, when Vin belongs to one of the quantums q13–q16 of the segment S8, at the end of the time interval T36 the contents of the cells C7 to C10 are Qr/2, Qr/4, Qr/8, Qr/16, respectively, those of the cells LC7 to LC10 are Qr/4, Qr/8, Qr/16, Qr/16, respectively, and the electric charge applied to the input I2 of the comparator COMP is equal to Qr/2+Qr/4+Qr/8 (FIG. 7). For the other FIGS. 8 to 11 it is also supposed that the Vin belongs to one of the quantums q13–q16.

In a similar way, as described above, the value of the bit b1 of the quantum code is determined during the time interval T37 and stored in the D-flipflop DFF3. This bit is 1 for the quantums q15, q16; q11, q12; q7, q8; q3, q4 and is 0 for the other quantums. At the end of this time interval the contents of the charge transfer devices CTD and LCTD73 to LCTD103 are as indicated on FIGS. 7 to 11.

For instance, when Vin belongs to one of the quantums q15–q16 of the segment S8, at the end of time interval T37 the contents of the cells C7 to C10 are Qr/2, Qr/4, Qr/8, Qr/16, those of the cells LC7 to LC10 are Qr/4, Qr/8, Qr/16, Qr/32, respectively, and the electric charge applied to the comparator COMP is equal to Qr/2+Qr/4+Qr/8+Qr/16 (FIG. 7). For the FIGS. 8 to 11 it is also supposed that Vin belongs to one of the quantums q15–q16.

Finally, during the time interval T38 the value of bit bo of the quantum code b3b2b1b0 is determined as follows.

By the sampling pulse P38 (FIG. 5) generated shortly after the start of this time interval T38:

electric charges equal to half the electric charges stored in the cells C7 to C10 of the CTD at the end of the time interval T37 are laterally deviated therefrom and stored under the electrodes ALTE73 to ALTE103 of the cells LC7 to LC10 of the LCTD73 to the LCTD103, respectively, in a similar way, as described above, for the sampling pulse P34. This operation is without importance;

the LOG73, LOG83, LOG93, LDG73, LDG83 and LDG93 are activated or inhibited depending on the condition of the DFF1, DFF2 and DFF3;

the lateral output gate LOG103 forming part of the LCTD103 is enabled for the duration of the pulse P38 via the OR-gate M11 so that the electric charge (Qr/32, . . . , Qr/2048) present under the LTE103 of the LCTD103 at the end of the time interval T37 is transferred under the output diode LOD103 from which this charge is supplied to the input I2 of the comparator COMP. As a consequence, a total electric charge, such as Qr/2+Qr/4+Qr/8+Qr/16+Qr/32 for S8 is applied to this input I2 and the D-flipflop DFF4 is accordingly triggered in its 1-condition (q16, q14, q12, . . . , q2) or 0-condition (q15, q13, . . . , q1) at the end of the pulse P38. This condition indicates the value of the bit b0 of the quantum code b3b2b1b0.

By the pulses 38 (FIG. 3) of the control pulse waveforms F1 to F3 and f1 to f3 the electric charges are then shifted in the CTD and in the LCTD73 to the LCTD103, but this has no effect on the condition of the D-flipflops DFF1 to DFF4. It should also be noted that the drain gate LDG103 is not used and that it has been provided for reasons of uniformity.

From the above, it follows that at the end of the time interval T38 the segment bis a2a1a0 are provided by the CTT, while the mantissa or quantum bits b3b2b1b0 are stored in the D-flipflops DFF1 to DFF4.

In connection with the above it should be noted that the ctd is not absolutely necessary. However, as well known, electric charges transferred in a charge transfer device suffer from a charge loss which is proportional to the number of stages of this device. By the presence of the ctd having a same number of stages as the CTD the Qin is also submitted to a charge loss before being compared in the comparator COMP with the charge transferred through the CTD. Thus, the effect of these charge losses is compensated to a certain extent.

The principles described above in connection with an analog-to-digital converter are also applicable for a digital-to-analog converter. Such digital-to-analog converter is in fact formed by the CTD and the gating means or control device associated thereto. Indeed, by introducing in the CTD electric charges corresponding to the values of the constituent bits of a digital input value and by suitably controlling the gating means associated to the CTD it is clear that it is possible to build up an output voltage corresponding to this digital value. It is also clear that the above described converter can be easily modified to operate according to the so-called μ-law.

Figure 12:
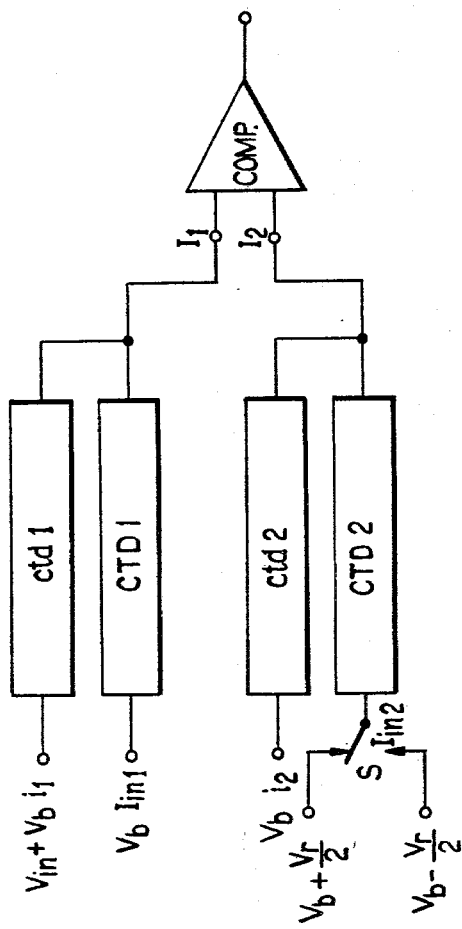
FIG. 12 represents another embodiment of a signal converter according to the invention.

Reference is now made to FIG. 12 which shows an analog-to-digital converter able to convert a positive or negative input voltage Vin to a digital value. It comprises two charge transfer devices ctd1 and ctd2 which are similar to the charge transfer device ctd of FIG. 1 and two charge transfer device CTD1 and CTD2 which are similar to the charge transfer device CTD of the same figure. The outputs of the ctd1 and the CTD1 are both connected to the input I1 of the comparator COMP, while the outputs of the ctd2 and the CTD2 are both connected to the input I2 of this comparator COMP. This converter is able to determine first the sign of an analog voltage to be converted and then the digital value corresponding to this voltage.

To determine the sign of an input voltage Vin a sum voltage Vin+Vb, Vb being a bias voltage, is also applied to the input il of the ctd1 and this bias voltage Vb is supplied to the input i2 of the ctd2. Consequently, the output comp of the comparator COMP becomes 1 or 0 depending on the Vin being positive or negative, respectively.

To obtain the digital value of the Vin the voltages applied to the converter to determine the sign are maintained, but the bias voltage Vb is further applied to the input I1 of the CTD1 while a voltage Vb+Vr/2 or Vb−Vr/2, Vr/2 being a reference voltage, is applied via a switch S to the input I2 of the CTD2 depending on the sign of Vin being positive or negative, respectively. Because the CTD1 and the CTD2 at their output provide a signal proportional to a voltage kVb and k(Vb+Vr/2), respectively, while ctd1 and ctd2 provide at their output a signal corresponding to Vin+Vb and Vb, respectively, k being a fraction of unity and is modified in a stepwise manner, e.g. k=½, ¼, ⅛, ... the signals applied to the inputs I1 and I2 of the comparactor COMP are proportional to Vin+(1+k)Vb and ±(kVr/2)+(1+k) Vb, respectively. Consequently, the output voltage of this comparator COMP is proportional to Vin±(kVr/2)

so that the Vin is in fact compared with ±(kVr/2) as in the case of FIGS. 1 and 2.

In connection with the above it should be pointed out that the described charge transfer device CTD is very compact and could, for instance, be replaced by a structure including the following units:

a charge transfer device which includes at least 6 cells each able to realize a division by 2 and corresponding in fact to cells C1–C6 of the CTD and which is able to provide output signals corresponding to the segments S1 to S8. Obviously, it would also be ossible to replace such a charge transfer device by a plurality of charge transfer devices each providing an output signal corresponding to a distinct one of these segments.

four other charge transfer devices corresponding to the lateral charge transfer devices LCTD73 to LCTD103 of the CTD, but including at least 7, 8, 9 and 10 cells, respectively, each able to realize a division by 2 so that these devices are able to provide output signals corresponding to the fractions of the segments.

Finally, it should be noted that the above described converter can be considered as comprising:

a signal generator formed by the CTD and the associated control device, because this generator produces a reference voltage which is compared with Vin;

a comparator COMP wherein this reference voltage is compared with Vin.

This reference voltage comprises a decreasing staircase-shaped voltage which is generated by means of the cells C1 to C6 of the CTD in a raising and decreasing staircaseshaped voltage which is generated with the help of the cells C7 to C10 and which is superimposed in a constant voltage which is provided at the output of the cells C11–C16.

While the principles of the invention have been described above in connection with specific apparatus, it is to be clearly understood that this description is made only by way of an example and not as a limitation on the scope of the invention.

We claim:

1. A signal generator to generate at its output a first variable output signal comprising:
   at least one first charge transfer device having a plurality of stages;
   clocking means coupled to given ones of said plurality of stages to clock a first input signal into said first transfer device and to step the contents thereof through said first transfer device; and
   an output circuit coupled to at least one of said plurality of stages to collect portions of said first input signal present in said one of said plurality of stages as a function of said first variable output signal to be generated and to further process said signal portions, said output circuit including
   first gating means formed as a part of said first transfer device coupled to said one of said plurality of stages to selectively collect and to gate said signal portions to said generator output.

2. A generator according to claim 1, wherein said clocking means repetitively clocks said first input signal into said transfer device.

3. A generator according to claim 2, wherein prior to said first gating means collecting and gating said signal portions from said one of said plurality of stages, said clocking means clocks said first input signal in all of said plurality of stages, and after this clocking said first gating means selectively collects and gates said signal portions from said one of said plurality of stages to said generator output according to a first predetermined law in order to form at said generator output successive portions of said first variable output signal.

4. A generator according to claim 1, wherein said first gating means includes
   auxiliary transfer device coupled thereto to temporarily store said collected signal portions before gating them to said generator output.

5. A generator according to claim 1, further including a second charge transfer device having a plurality of cells and a second device output coupled to said generator output to enable said selectively collected and gated signal portions to be combined with signals appearing at said second device output to provide a second variable output signal.

6. A generator according to claim 5, wherein prior to said first gating means collecting and gating said signal portions from said one of said plurality of stages, a second input signal is clocked in all of said plurality of cells to enable said second input signal to be combined with said successive portions of said first variable output signal to provide said second variable output signal.

7. A generator according to claim 6, wherein said successive portions of said first variable output signal are all factions of said second input signal.

8. A generator according to claim 5, wherein
said second transfer device is coupled in cascade with said first transfer device and is clocked by said clocking means coupled to all of said plurality of cells, said generator output being connected to said second device output.

9. A generator according to claim 6, further including
a third charge transfer device having a plurality of auxiliary cells coupled in cascade with said first transfer device; and
second gating means formed as part of said first and third transfer devices coupled to said auxiliary cells to selectively collect and remove portions of signals stored therein according to a predetermined law and to enable signal portions remaining in said third transfer device and stepped therethrough to form successive portions of a third variable output signal.

10. A generator according to claim 9, wherein
said clocking means is coupled to said third transfer device to repetitively clock a third input signal in said third transfer device.

11. A generator according to claim 10, wherein
said second gating means controls said third transfer device in such a way that said third variable output signal has a staircase shape with an end value equal to the value of said second input signal.

12. A generator according to claim 11, wherein
said clocking means, said first gating means and said second gating means operate in such a way that said third variable output signal and said second variable output signal successively appear at said second device output.

13. A generator according to claim 9, wherein
each of said plurality of cells and each of said plurality of auxiliary cells includes several stages.

14. A generator according to claim 9, wherein
said second gating means is able to deviate and remove charge portions from each of said aixiliary cells.

15. A signal converter comprising:
a comparator for comparing a comparator input signal to be converted with a first reference signal and for providing a comparator output signal when said comparator input signal and said first reference signal satisfy a predetermined relationship, said comparator having a first input to receive said comparator input signal, a second input for receiving said first reference signal and an output at which appears said comparator output signal; and
a signal generator according to claim 38 to provide said first reference signal.

16. A converter according to claim 15, wherein
said first reference signal includes said third and second variable output sginals successively appearing at said second device output.

17. A converter according to claim 16, wherein
said second gating means is coupled to said comparator output to be controlled by said comparator output signal in such a way that said staircase-shaped third variable output signal includes a first part varying between said third input signal and a second reference signal and a second part varying between said second reference signal and said end value, said end value being equal to the value of a step of said first part of said third variable output signal for which said comparator output signal becomes activated during the comparison of said first part of said third variable output signal with said comparator input signal, or zero when said comparator output signal does not become activated during said comparison.

18. A converter according to claim 17, wherein
said first part of said third variable output signal varies according to a segmented law.

19. A converter according to claim 18, wherein
said first gating means is coupled to said comparator output to be controlled by said comparator output signal in such a way that said second variable output signal includes a fixed part having said second input signal on which are successively superimposed fractions equal to said second input signal divided by 2, 4, 8, ..., said fractions being continued to be superimposed as long as said comparator output signal remains activated.

20. A converter according to claim 19, wherein
said second variable output signal determines to which of a number of equal factions of a segment of said regimented law said comparator input signal corresponds.

21. A converter according to claim 15, further including
a fourth transfer device coupled to said clocking means and said first input of said comparator, said fourth transfer device being clocked in synchronism with said first, second and third transfer devices and said comparator input signal being stepped through said fourth transfer device before being coupled to said first input of said comparator.

22. A converter according to claim 21, wherein
said fourth transfer device is a charge transfer device.

23. A converter according to claim 16, wherein
said first transfer device includes
further gating means to selectively enable and prevent said first reference signal at said second device output to be applied to said second input of said comparator.

24. A converter according to claim 21, wherein
said converter comprises
a first overall transfer device including said first, second and third transfer devices,
said fourth transfer device,
a second overall transfer device similar to said first overall transfer device,
a fifth transfer device similar to said fourth transfer device,
the output of said first overall transfer device being coupled to said second input of said comparator,
the output of said second overall transfer device being coupled to said first input of said comparator,
the output of said fourth transfer device being coupled to said first input of said comparator,
the output of said fifth transfer device being coupled to said second input of said comparator,
first means to apply a first predetermined reference signal to the input of both said second overall transfer device and said fifth transfer device and to apply a sum signal formed by said first predetermined reference signal and an input signal to be converted to the input of said fourth transfer device, and
additional gating means to apply selectively to the input of said first overall transfer device a sum or a difference of said first predetermined reference signal and a second predetermined reference signal depending on the sign of said input signal to be converted which is determined by said fourth and fifth transfer devices.

* * * * *